United States Patent [19]
Temple

[11] Patent Number: 4,999,684
[45] Date of Patent: Mar. 12, 1991

[54] SYMMETRICAL BLOCKING HIGH VOLTAGE BREAKDOWN SEMICONDUCOTR DEVICE

[75] Inventor: Victor A. K. Temple, Clifton Park, N.Y.

[73] Assignee: General Electric Company, Schenectady, N.Y.

[21] Appl. No.: 435,632

[22] Filed: Nov. 13, 1989

Related U.S. Application Data

[62] Division of Ser. No. 190,903, May 6, 1988.

[51] Int. Cl.⁵ .................. H01L 29/90; H01L 29/40
[52] U.S. Cl. ............................... 357/13; 357/53; 357/56; 357/50
[58] Field of Search ............... 357/53, 55, 56, 52, 357/13, 48, 50

[56] References Cited

U.S. PATENT DOCUMENTS

| | | | |
|---|---|---|---|
| 4,095,252 | 6/1978 | Ochi | 357/43 |
| 4,215,358 | 7/1980 | Wataze et al. | 357/56 |
| 4,667,393 | 5/1987 | Ferla et al. | 357/20 |
| 4,774,560 | 9/1988 | Coe | 357/52 |
| 4,866,495 | 9/1989 | Kinzer | 357/23.4 |

FOREIGN PATENT DOCUMENTS 56-66368  10/1981  Japan ..................... 357/55

Primary Examiner—Andrew J. James
Assistant Examiner—D. Monin
Attorney, Agent, or Firm—Marvin Snyder; James C. Davis, Jr.

[57] ABSTRACT

A symmetrical blocking high breakdown voltage semiconductor device in which the lower junction termination is brought to the upper surface is fabricated by diffusing first and second regions of a first conductivity type into an upper surface of an epitaxial layer of a second conductivity type disposed on a substrate, and forming a groove having sloped sidewalls in the upper surface such that the groove extends through the second diffused region, the epitaxial layer and into the substrate. A thin layer of impurities of the first conductivity type is implanted into the sidewalls, and the impurities are electrically activated to form a low resistivity path that connects the substrate to the second diffused region. Subsequently, the semiconductor device may be separated from the wafer by cutting the wafer at the groove. The manufacturing process enables substantially complete fabrication of a plurality of devices while still in wafer form, thereby avoiding the inconvenience of processing individual dice.

13 Claims, 5 Drawing Sheets

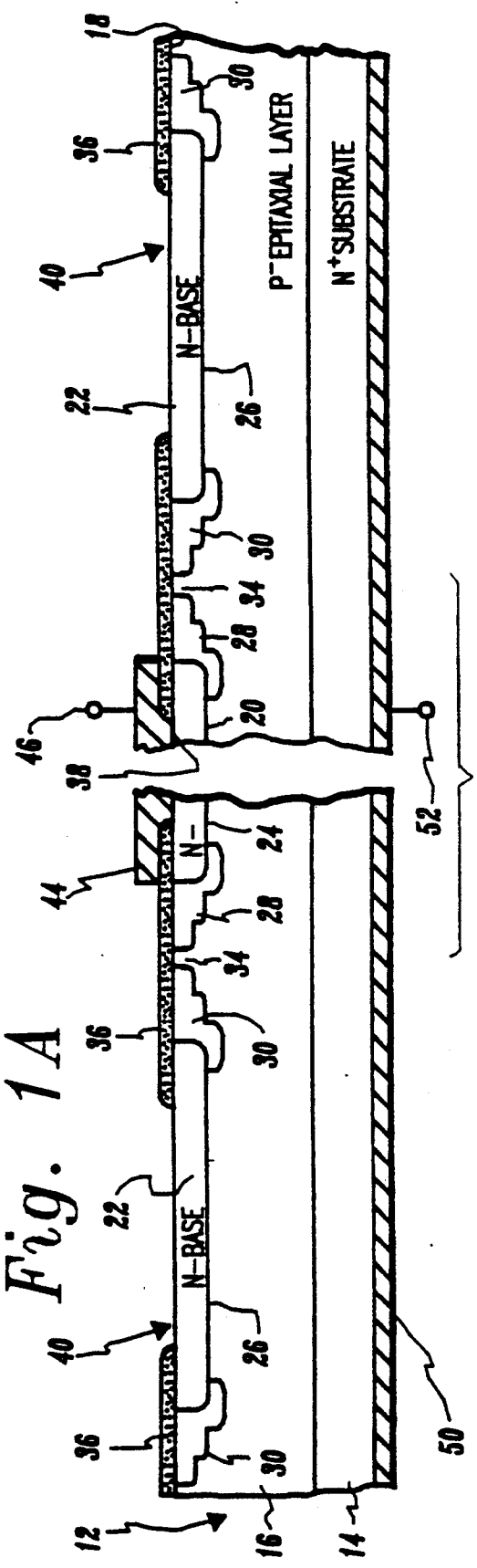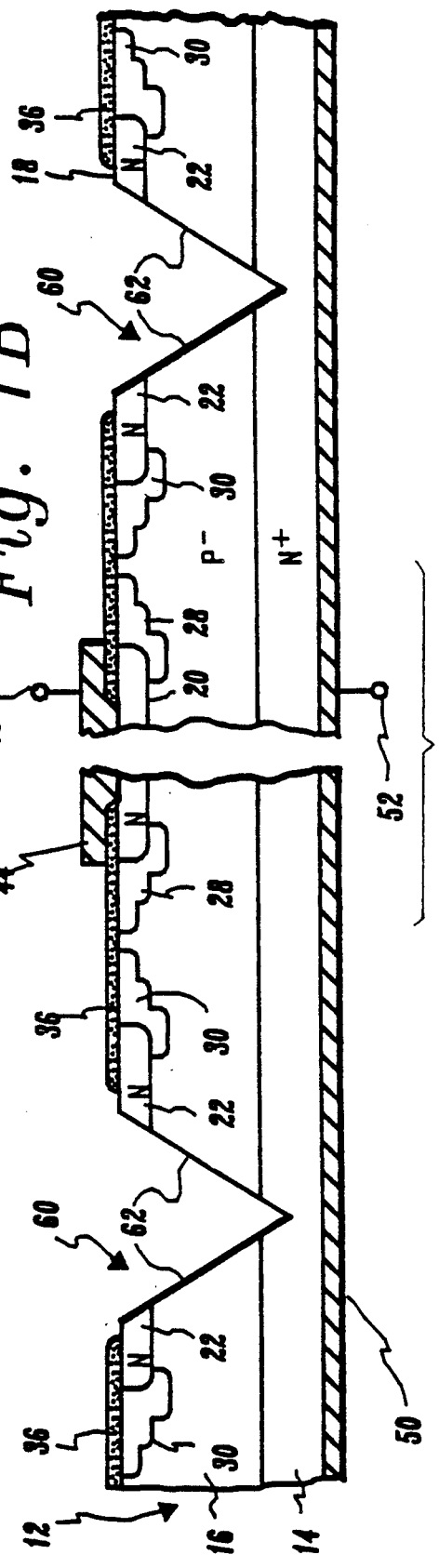

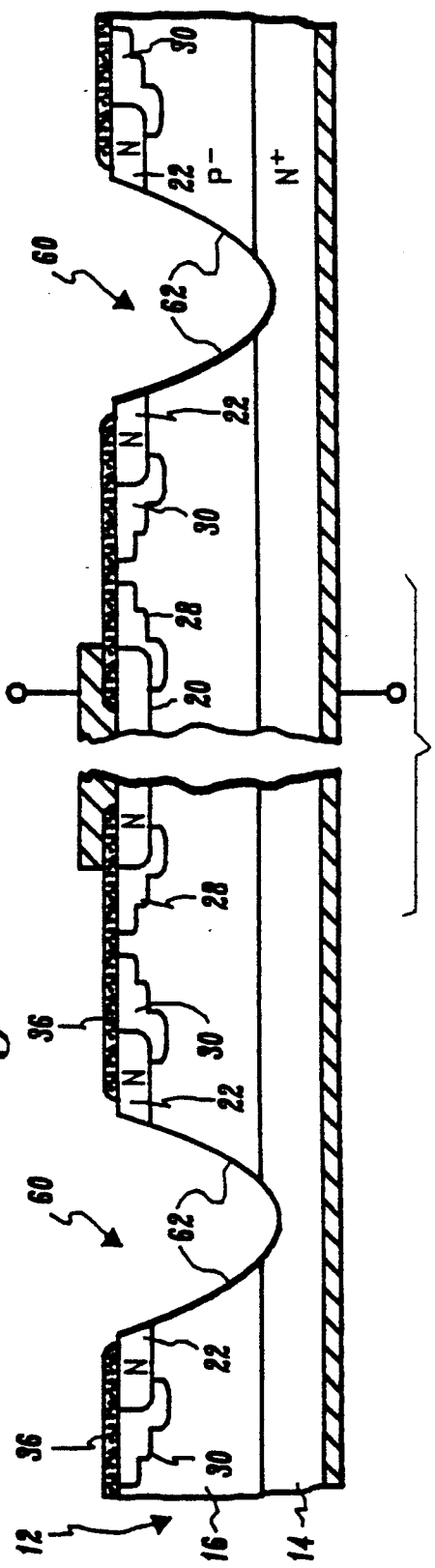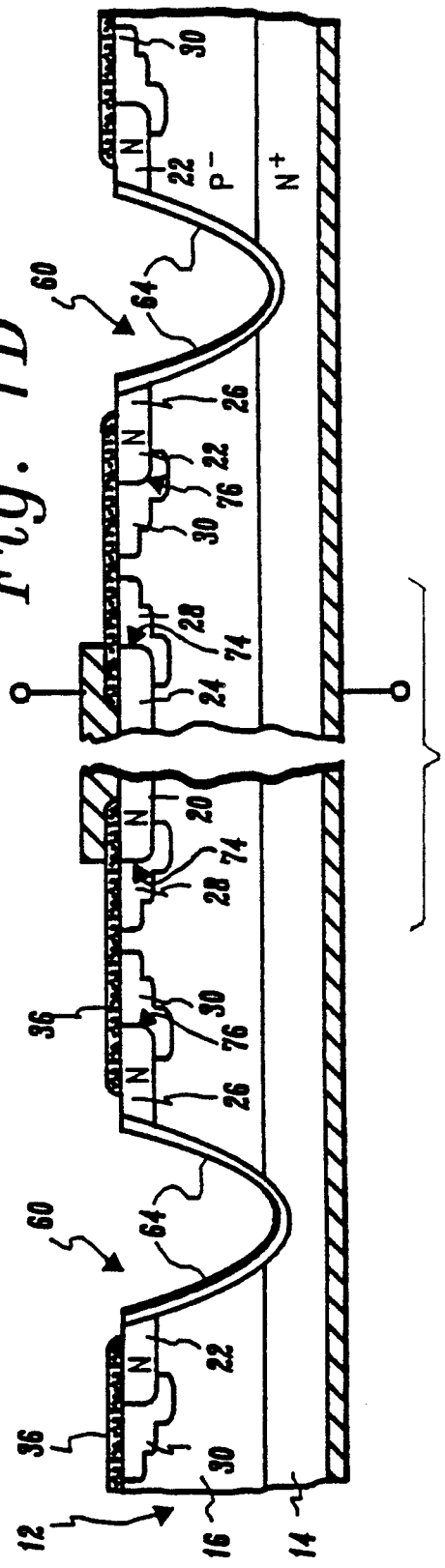

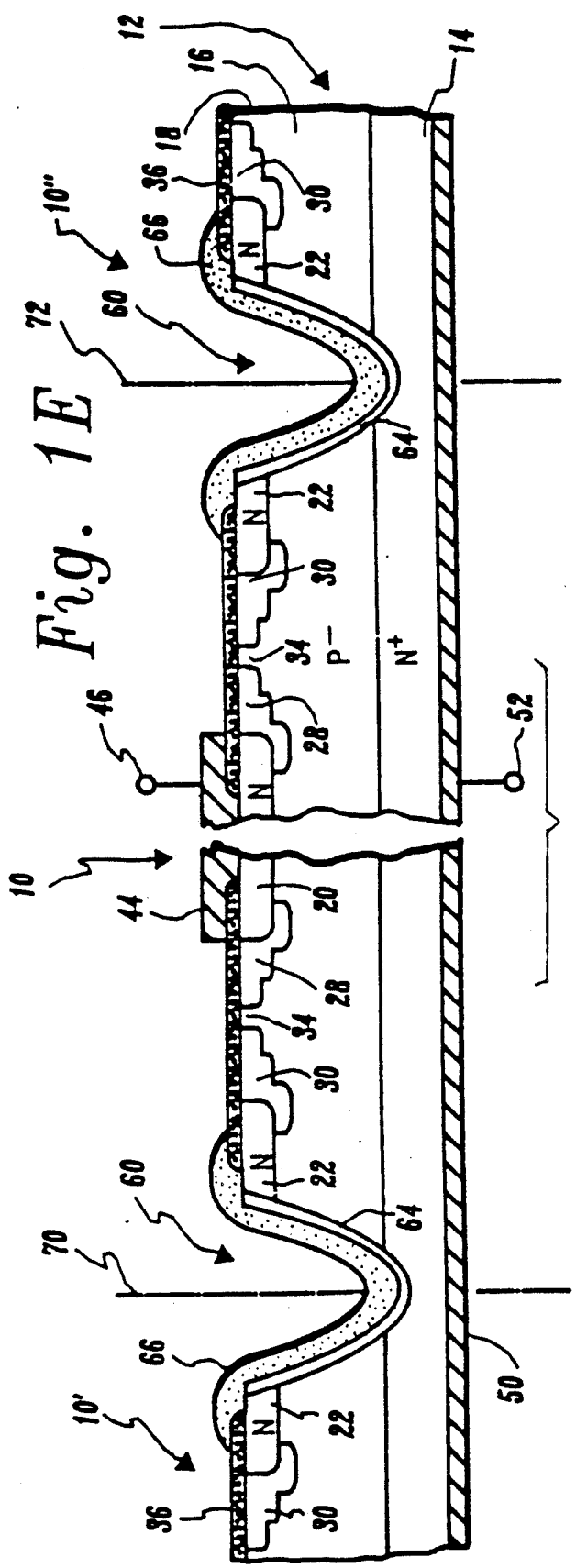
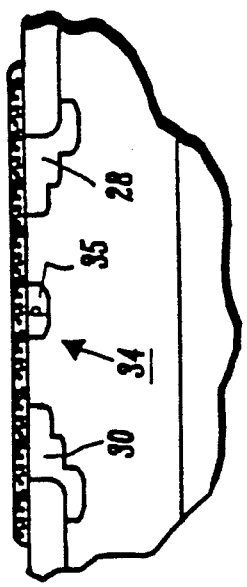
Fig. 1E
Fig. 3

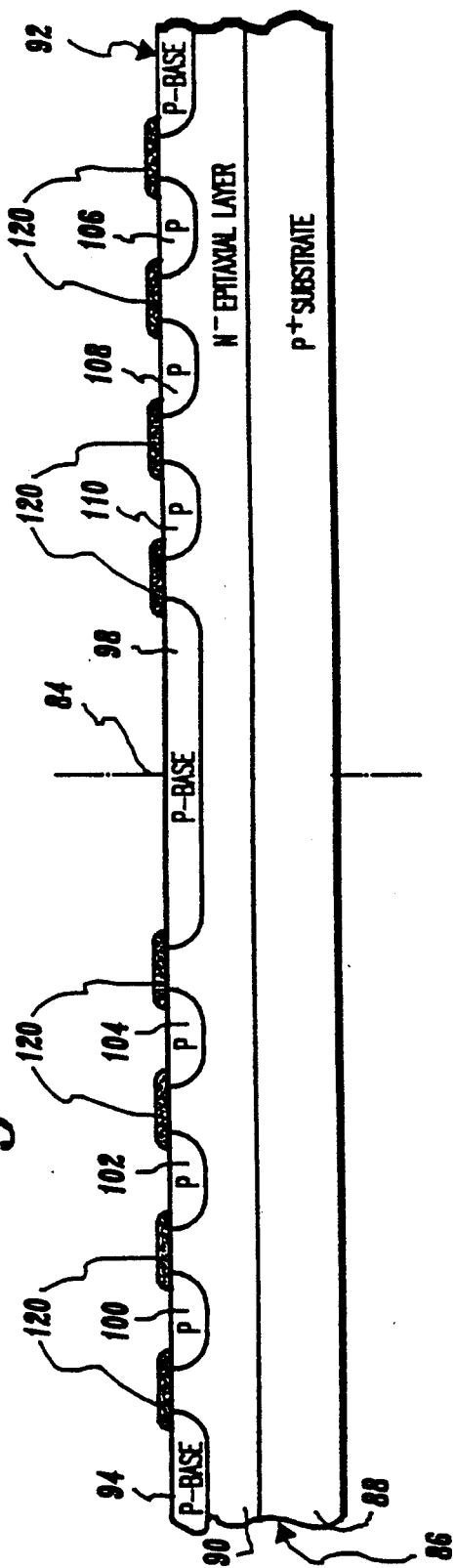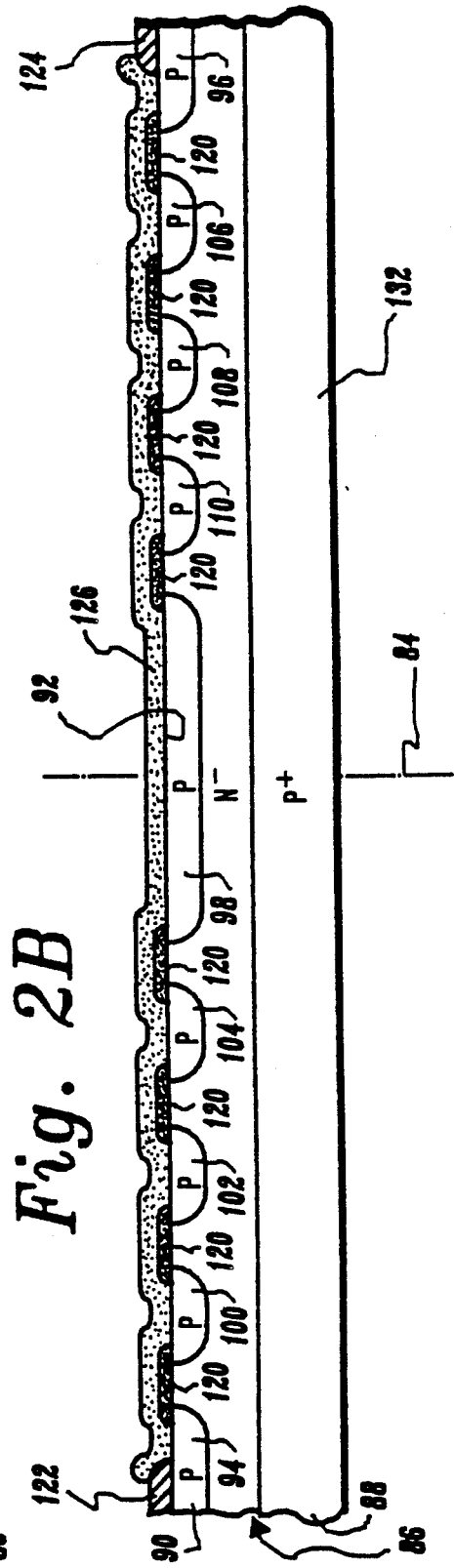

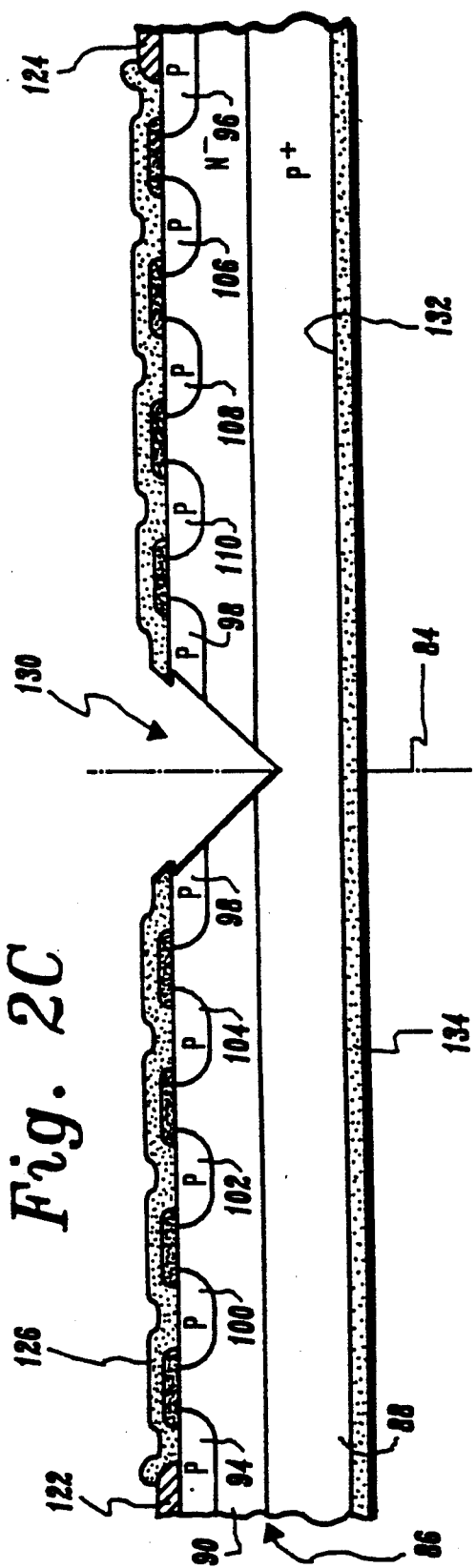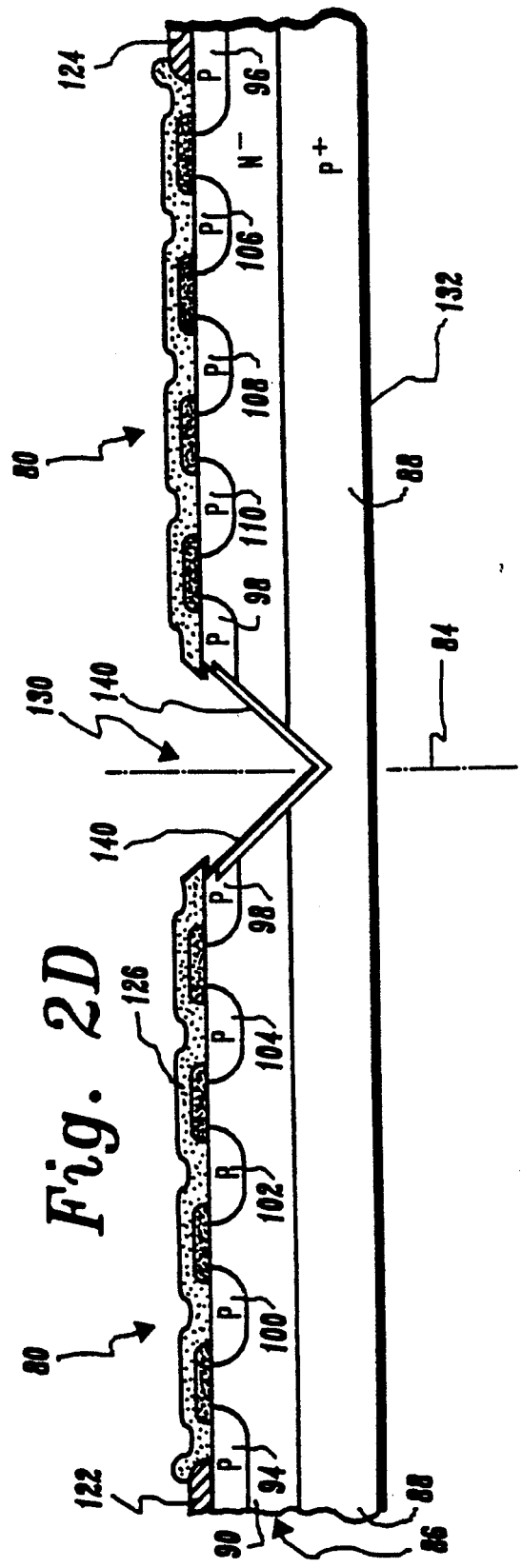

SYMMETRICAL BLOCKING HIGH VOLTAGE BREAKDOWN SEMICONDUCOTR DEVICE

This is a division of application Ser. No. 190,903, filed 5/6/88, now U.S. Pat. No. 4,904,609.

BACKGROUND OF THE INVENTION

This invention relates generally to high voltage breakdown semiconductor devices and fabrication techniques therefor, and more particularly to a structure in which the lower junction termination of a multilayer semiconductor device formed in a wafer is extended to the top surface of the wafer, and a method of fabricating such structure.

There are many circuit applications for semiconductor devices which provide symmetrical blocking of applied voltages of different polarities and which exhibit high reverse breakdown voltages. In fabricating such device, it is necessary to control the geometries and characteristics of the device junctions. This can be accomplished by fabricating the device with a lateral, rather than vertical, structure. By bringing the lower junction termination of the device to the top surface of the wafer, better control of the symmetry and breakdown characteristics of the device can be achieved; however, this requires that the substrate of the device be electrically connected to the top surface of the wafer. While there are known ways to connect the substrate of a semiconductor device to its top surface, they generally have disadvantages which complicate the manufacture of semiconductor devices, such as the necessity of performing processing steps on each individual die. This is difficult and hence disadvantageous from a manufacturing standpoint.

It is desirable to provide a semiconductor device of relatively simple construction, having symmetrical blocking and high voltage breakdown characteristics, with its substrate being electrically connected to active layers on its upper surface, and a method of fabricating such a device which is suitable for large scale production. It is to this end that the present invention is directed.

SUMMARY OF THE INVENTION

The invention affords a simple and convenient method of manufacturing semiconductor devices of the type comprising a plurality of diffused regions in an epitaxial layer disposed on a substrate, in which a lower junction termination of the device is brought to the upper surface of the device by a electrically connecting the substrate to an active layer on the upper surface. By this method, semiconductor devices which exhibit symmetrical blocking characteristics and high reverse breakdown characteristics can be fabricated. The method is applicable, for example, to the fabrication of insulated gate transistor (IGT) devices such as described and claimed in B. J. Baliga application Ser. No. 816,918, filed Jan. 8, 1986 and assigned to the instant assignee, which is a continuation of abandoned application Ser. No. 483,009, filed Apr. 7, 1983, which is a continuation of abandoned application Ser. No. 212,181, filed Dec. 2, 1980, and MOS controlled thyristor (MCT) devices, such as described and claimed in V.A.K. Temple application Ser. No. 707,309, filed Mar. 1, 1985 and assigned to the instant assignee, which is a continuation of abandoned application Ser. No. 391,620, filed June 24, 1982, which is a continuation-in-part of abandoned application Ser. No. 331,049, filed Dec. 16, 1981.

Briefly stated, in one aspect of the invention, a method of fabricating a symmetrical blocking high breakdown voltage semiconductor device comprises providing a substrate of semiconductor material of a first conductivity type having thereon an epitaxial layer of a second conductivity type. First and second laterally spaced regions of the first conductivity type are formed in an upper surface of the epitaxial layer. The first and second regions form, with the epitaxial layer, respective first and second PN junctions. A groove having sloped sidewalls is next formed so as to extend from the upper surface of the epitaxial layer through the second region and the epitaxial layer into the substrate. Impurities of the first conductivity type are then implanted into a sidewall of the groove to form a thin implanted layer. The device is thereafter annealed sufficiently to activate the impurities in the thin implanted layer in order to electrically connect the second diffused region to the substrate.

In another aspect, a symmetrical blocking semiconductor device having high breakdown voltage comprises a semiconductor substrate of a first conductivity type having an epitaxial layer of a second conductivity type thereon. A main region of the first conductivity type is formed in an upper surface of the epitaxial layer and a second region of the first conductivity type is formed in the upper surface surrounding the main region and spaced therefrom. A sloped sidewall of the device extends from the upper surface through the secondary region and epitaxial layer and into the substrate. A thin implanted layer of impurities of the first conductivity type is provided in the sidewall to electrically connect the secondary region to the substrate.

An advantage of the invention is that a plurality of devices may be formed simultaneously on a wafer, thereby facilitating handling and processing. The connection of the substrate to the top surface of the wafer may be made after most, if not all, of the conventional processing techniques required to form the device have been completed. At this juncture, a V-shaped groove may be cut into the top surface of the wafer so as to intersect the secondary region, and the surface quality of the sidewalls of the groove may be restored by using a chemical etch. Impurities of the appropriate type may be then implanted into the sidewalls of the groove, and the device may subsequently be annealed sufficiently to activate the impurities and electrically connect the substrate to the top surface. If desired, a passivation layer may be applied to the sidewalls of the groove to complete the fabrication. Thereafter, the individual devices may be separated from one another at the grooves.

Accordingly, one object of the invention is to provide a method for bringing the reverse voltage blocking junction in semiconductor devices containing PNP structures to the top surface of the wafer.

Another object is to provide a semiconductor device in which a sloped sidewall electrically connects the substrate of the device to the top surface of the device.

Another object is to provide a semiconductor device containing a PNP structure wherein a deep reverse voltage blocking junction is terminated at the device surface.

Other objects and advantages of the invention will become apparent from the description which follows.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

FIGS. 1A-1E comprise a series of cross-sectional views which illustrate successive steps in the fabrication of a semiconductor device in accordance with a first embodiment of the invention;

FIGS. 2A-2D comprise another series of cross-sectional views which illustrate successive steps in the fabrication of a semiconductor device in accordance with another embodiment of the invention; and FIG. 3 is a fragmentary, cross-sectional view illustrating a modification of the first embodiment of the invention.

DESCRIPTION OF PREFERRED EMBODIMENTS

The invention is particularly applicable to fabrication of a semiconductor device which exhibits symmetrical blocking and high voltage breakdown and will be described in that context. It will become apparent, however, that the invention is also applicable to other types of devices and that the description herein is illustrative of only one utility of the invention. The invention may be used, for example, to fabricate devices such as IGTs and MCTs, and is especially suited to devices wherein the substrate is heavily doped and reasonably thick compared to the active layers of the device.

FIGS. 1A-1E illustrate successive processing steps during fabrication of a semiconductor device in accordance with a first embodiment of the invention. The invention is not concerned with, and the figures do not illustrate, the conventional steps required to fabricate a semiconductor device, such as the various masking, implantation, or diffusion steps necessary to form different P or N type active regions. The steps illustrated in FIGS. 1A-1E are those which, in accordance with the invention, afford the device symmetric blocking capability and affect device breakdown voltage. Also, for clarity and ease of illustration, the figures are not drawn to scale.

In FIG. 1A, a semiconductor device in accordance with the invention is shown at a particular stage near completion of its fabrication. The device may be formed on a semiconductor wafer 12, such as of silicon, comprising a heavily doped N+ substrate 14 upon which a lightly doped P− epitaxial layer 16 has been grown, as by using conventional epitaxial techniques. Into the upper surface 18 of the epitaxial layer, there may be diffused a first or main N-base region 20 and a secondary N-base region 22 which surrounds the main diffused region 20 and is laterally spaced therefrom. Secondary N-base region 22 may be, for example, annularly or rectangularly shaped in the plane of the upper surface. The main and secondary N-base regions form respective first and second P-N junctions 24 and 26 with epitaxial layer 16. Junction 24 of the main N-base region may be terminated at its sides by a junction termination extension (JTE) N-type diffusion 28, and junction 26 of the secondary N-base may be similarly terminated by a JTE N-type diffusion 30 at each of its sides. JTE (See V.A.K. Temple, "Increased Avalanche Breakdown Voltage and Controlled Surface Electric Fields Using a Junction Termination Extension (JTE) Technique" *IEEE Transactions on Electron Devices* ED30, pp. 954–957, 1983) is a method to reduce surface and bulk fields in a junction termination. This technique is the preferred choice but any one of a number of alternatives is possible including use of field rings and field plates. In each JTE diffusion, the concentration of donor impurities varies with lateral distance from the side of the N-base and varies with depth from upper surface 18 of the epitaxial layer, the concentration decreasing with lateral distance and with depth into the epitaxial layer. Adjacent portions of JTE diffusions 28 and 30 are spaced at their upper surfaces by a lateral gap 34 at the upper surface of P− epitaxial layer 16.

Upper surface 18 of epitaxial layer 16 may be coated with a passivation layer 36, as of glass or silicon nitride, which is provided with openings 38 and 40 for access to the main and secondary N-base regions 20 and 22, respectively. A metal contact 44, as of aluminum, having an electrode 46 connected thereto, may be deposited on main N-base 20 through opening 38 to provide an electrical connection thereto. A backside metal contact layer 50 having an electrode 52 connected thereto may be provided on the underside of substrate 14, and preferably covers the entire backside of the substrate. As described in more detail, infra, a plurality of semiconductor devices are simultaneously formed side-by-side on wafer 12.

Thickness and doping level of layer 16 are set by the desired voltage level and are known to those skilled in the art. For example, for a 1,000 volt device, epitaxial layer 16 has a thickness of the order of 150 microns and an acceptor concentration, for example, boron, of the order of $10^{14}$ atoms/cm$^3$. The N-base diffusions may have a junction depth of the order of 10 microns, and a donor concentration, for example, phosphorus, of the order of $5.0 \times 10^{16}$ atoms/cm$^3$. The JTE diffusions may have a junction depth (in their 100% concentration zones) of the order of 10.9 microns, and a surface concentration of the order of $8.5 \times 10^{15}$ atoms/cm$^3$.

As shown in FIG. 1B, in order to electrically connect substrate 14 to the top surface 18 of the device, and in particular to the secondary N-base region 22, the secondary N-base region may be intersected throughout its entire length in the plane of the surface by a V-shaped groove 60 which extends through the N-base region and the epitaxial layer and into the substrate. Groove 60 need not necessarily be V-shaped but preferably has sidewalls 62 which are sloped, i.e., inclined relative to the vertical. The groove may be formed using a commercial silicon saw having a V-groove blade; alternatively, the groove may be preferentially etched, cut with a laser, or mechanically beveled. It is essential that the groove extend into the substrate, since the electrical connection between the substrate and top surface of the wafer will follow the groove walls, although it is preferable that the groove extend only a short distance into the substrate so as to leave the bulk of the substrate intact and thereby avoid unduly weakening the wafer. Formation of the groove preferably takes place after all other processing of the planar structure of wafer 12, as shown in FIG. 1A, has been completed. This is because wafers that are grooved are fragile and more likely to break during handling, and spinning photoresist uniformly over a grooved surface is difficult at best.

Following formation of the V-shaped groove in secondary N-base region 22, as shown in FIG. 1B, the wafer may be subjected to a chemical etch which etches away a certain amount of silicon at sidewalls 62 of groove 60 to restore the surface quality which may have been impaired during the groove-formation process. A silicon saw, for example, is an abrasive tool which may leave microcracks and notches in the surface of the silicon, and these can be substantially removed by a chemical etch. FIG. 1C illustrates groove 60 after the etching process. As shown, the groove assumes a more rounded shape following etching.

After etching of the groove has been completed, the substrate is electrically connected to secondary N-base region 22 by forming a thin N+ layer 64 on the sidewalls of the groove, as shown in FIG. 1D. This may be accomplished by implanting a high concentration of N-type acceptor impurities, such as phosphorus, into the groove sidewalls, and annealing the wafer at a low temperature in order to electrically activate the impurities. Implantation is facilitated by the fact that the groove sidewalls are inclined from the vertical. The low temperature annealing process may comprise, for example, heating the wafer at a temperature of the order of 450° C. for a time of the order of 30 minutes. This is sufficient to electrically activate the impurities without allowing them to diffuse very far into the sidewall material. The low temperature annealing process results in a rather thin implanted layer 64 of N-type material having a thickness of the order of 0.25 microns, for example. The implanted layer in the opposite sidewalls of the groove forms a low resistivity path which electrically connects the substrate to the two portions of secondary N-base region 22 formed as a consequence of the integral secondary N-base region being intersected by the groove, as shown.

Implanted sidewall layer 64 may be passivated by depositing thereon a passivation layer 66, such as a polyamide, for example, as shown in FIG. 1E. The completed semiconductor device 10 may then be separated from the wafer at grooves 60, as indicated by centerlines 70 and 72. Note that if the activated sidewall implant charge is greater than $3 \times 10^{12}$ or $4 \times 10^{12}/cm^2$, the surface of the sidewall will be at zero electric field, likely obviating the need for sidewall passivation.

It is desirable to fabricate simultaneously a plurality of devices on wafer 12. Thus, the devices may be arranged on the wafer such that each half of a groove 60 forms part of an adjacent device. Accordingly, to the left of centerline 70 and to the right of centerline 72 in FIG. 1E, there preferably are other devices 10' and 10" which are identical to semiconductor device 10. Devices 10, 10' and 10" may be separated by breaking or cutting the wafer shown in FIG. 1E at the grooves, i.e., at lines 70 and 72. The separated devices may then be packaged in conventional manner.

A significant advantage of the invention is that it enables substantially complete fabrication of a plurality of devices while they are still in wafer form, prior to each individual die being broken out of the wafer. This is important from a mechanical standpoint since a wafer is much easier to handle and process than an individual die. Moreover, previously noted, it is easier to implant impurities into the sloped sidewalls of the grooves than it is to implant impurities into vertical sidewalls of grooves. After passivation of the sidewall implant at the completion of fabrication, the grooves afford a convenient place for dicing the wafer into individual devices.

The devices in the wafer illustrated in FIGS. 1A-1E essentially show only the three layers necessary for symmetric blocking, and could be termed "wide base transistors" or "WBTs". The wafer contains a center WBT and an edge WBT. Terminal 46 comprises the "top" terminal and terminal 52 comprises the "bottom" terminal. The center WBT comprises the substrate, the main N-base diffusion 20 and the epitaxial layer, and the diffusion and JTE termination design may be equivalent to that of present IGT or MCT structures. The side WBT comprises the substrate, the surface N-base diffusions 22 and the JTE regions (the same diffusions as the center diode), the N-sidewall layer 64, and the N+ substrate 14. By using similar geometries for the junction terminals of the center and side WBTs, and by controlling the lateral epitaxial gap 34 width and the doping concentration of the epitaxial layer, device 10 may be provided with symmetric blocking properties. Breakdown of either junction should then occur in the silicon bulk at the junction terminations, and the identical terminating geometries should produce symmetric breakdown voltages. The epitaxial layer 16 should be uniformly doped for symmetrical blocking. When the upper junction of the center WBT is reverse biased, it blocks voltage as does a conventional asymmetric MCT or IGT structure, and breakdown occurs at regions 74 at the sides of the main N-base diffusion 20 where the junction is terminated by the JTE diffusions 28. Similarly, when the side WBTs are reverse biased, breakdown occurs in regions 76 at the sides of the secondary N-base diffusions 22 where they are terminated by JTE diffusions 30. A key advantage is that surface field regions of both center and edge WBTs are formed at the same time and both are passivated before the groove formation, groove etch and implant are done.

FIGS. 2A-2D illustrate another embodiment of the invention by which somewhat different semiconductor devices are fabricated. FIGS. 2A-2D differ from FIGS. 1A-1E in that FIGS. 1A-1E illustrate fabrication of a whole device 10 which is later separated from its wafer at the two V-shaped grooves (at lines 70 and 72) on opposite sides of the device. In contrast, FIGS. 2A-2D show fabrication of one-half of each of two devices which are subsequently separated about a centerline 84. Each of the devices is symmetric with respect to its center, and FIGS. 2A-2D conveniently illustrate the simultaneous fabrication of plural devices.

A principal difference between the device fabricated in the stages illustrated in FIGS. 2A-2D and device 10 of FIG. 1E is that device 80 does not employ a junction termination extension to terminate its junctions. Rather, it employs a plurality of field rings for imparting a high breakdown voltage. Also, whereas FIGS. 1A-1E illustrate an NPN structure, FIGS. 2A-2D illustrate a PNP structure. It will be appreciated, however, that the conductivity types of the two structures are merely illustrative, and that they may be reversed to form a structure of the opposite conductivity type.

FIG. 2A illustrates a wafer 86 comprising a substrate 88 of heavily doped P+ material with a lightly doped N− epitaxial layer 90 having a thickness of the order of 150 microns formed thereon. In the upper surface 92 of the epitaxial layer, there may be diffused first and second main P-type regions 94 and 96, respectively, one for each of the two devices on opposite sides of centerline 84. A secondary region 98 of P-type material may also be diffused in the upper surface of the epitaxial layer midway between main regions 94 and 96, as shown in the figure. When the wafer is subsequently split at line 84, one-half of secondary region 98 will be associated with each of the two devices thus formed. To the left of centerline 84, main region 94 may be separated from secondary region 98 by a plurality of concentric field rings 100, 102 and 104, each of which may comprise an annular-shaped diffused region of P-type material which surrounds main region 94. As is well known, a field ring structure affords a high breakdown voltage by dividing the applied potential between the main junction and the ring junctions at the top surface as the depletion region spreads laterally from the device center, i.e., from main P-type region 94 or 96. The field ring structure serves a function similar to that of the JTE diffusions of device 10 shown in FIG. 1E, although the JTE diffusions have the advantage of providing higher breakdown voltages while consuming less surface area.

In similar fashion, main region 96 may be separated from secondary region 98 by a plurality of field rings comprising annular-shaped P-type diffusions 106, 108 and 110 which concentrically surround region 96. The various P-type diffusions (i.e., the main and secondary regions and the field rings) in the upper surface of the epitaxial layer may be formed by conventional masking, passivation layer formation, and diffusion, and a silicon dioxide mask layer 120 may be retained throughout the remainder of the process to become the primary junction passivation layer.

After formation of the field rings, metal contacts 122 and 124 may be provided to the main regions 94 and 96, respectively, and a secondary passivation layer 126, such as silicon nitride or glass, may be applied over upper surface 92 and mask 120, as shown in FIG. 2B. Metal contacts 122 and 124 will subsequently provide electrical contact to main regions 94 and 96. As shown in FIG. 2C, a V-shaped groove 130 centered on line 84 may next be formed in the upper surface of the wafer so as to intersect secondary region 98. Groove 130 is formed so that it extends through secondary region 98 and epitaxial layer 90 and into substrate 88. In addition, underside 132 of the substrate may have applied thereto a protective layer 134, such as wax or photoresist, to protect the underside from the chemical etchant used to clean up the sides of the V-shaped groove.

After chemically etching the groove to restore the surface quality of its sidewalls, the sidewalls may be implanted with a high concentration of P-type impurities to form a thin layer 140 of P-type implanted material, as shown in FIG. 2D. The P-type impurities in layer 140 may be electrically activated by a low temperature annealing process, as previously described, to provide a low resistivity path that electrically connects to substrate 88 the two portions of secondary region 98 intersected by the groove. The low temperature is desirable so as not to exceed the temperature limits imposed by other layers (e.g. aluminum metallization) that may be present. At this juncture, fabrication is almost completed. All that remains is to provide a metal contact on underside 132 of the substrate (protective layer 134 having been removed after the chemical etch), and to break the wafer at the V-shaped groove, about line 84, to separate the two finished devices 80. Prior to separation, P-type sidewall implant 140 may be passivated by applying another passivation layer.

As an alternative, it is possible to perform a conventional diffusion at the step illustrated in FIG. 2D to form the sidewall implant. In this case, if metal is present, it must be a refractive metal or refractive metal-silicide so that it can withstand the elevated temperature of a conventional diffusion. Subsequently, the wafer can be metalized, as with aluminum, and patterned with a negative resist which would protect exposed areas and would not require step coverage or high light intensity in the grooves as would a positive resist. Also, in some instances, it may be desirable to substitute for center field ring diffusions 102 and 108 an N+ field stop diffusion to afford better breakdown characteristics. Such field stop diffusion can be useful in the JTE case as well. In the structure illustrated in FIG. 1, this would involve locating a P-type diffusion in the center of region 34. A field stop diffusion 35 of this type is shown in FIG. 3. Such diffusion adds extra space to the termination since the field stop width should be between about 0.5 and 1.0 depletion widths of the blocking region and separated by about the same distance from regions 30 and 28. If surface charge is small or of opposite sign to the depleted JTE or field ring then such N+ field stop diffusion would not be necessary.

The processing steps illustrated in FIGS. 2A-2D afford the same advantages as those discussed above with respect to FIGS. 1A-1E in that they permit complete fabrication of a plurality of devices while the devices are still in wafer form. Also, use of a groove with sloped sidewalls, such as V-shaped grooves 64 and 130, is convenient in enabling the implantation of impurities into the sidewall to electrically connect the substrate to the diffused region at the upper surface of the wafer. This is highly advantageous in enabling the lower junction termination of the device to be brought to the upper surface, and facilitates fabrication of a symmetrical blocking high breakdown voltage device since it affords better control of the geometry and the characteristics of the diffused regions on the upper surface.

While preferred embodiments of the invention have been shown and described, it will be appreciated by those skilled in the art that variations in these embodiments may be made without departing from the principles and the spirit of the invention, the scope of which is defined in the appended claims.

What is claimed is:

1. A symmetrical blocking high breakdown voltage semiconductor device comprising a semiconductor substrate of a first conductivity type; an epitaxial layer of a second conductivity type disposed on the substrate; a main region of the first conductivity type extending into said epitaxial layer from an upper surface thereof; a secondary region of the first conductivity type extending into said epitaxial layer from the upper surface thereof and surrounding the main region, said secondary region being spaced from said main region and having a sloped sidewall surface; said sloped sidewall surface extending from the upper surface of said epitaxial layer through the secondary region and the epitaxial layer and into the substrate; the main and secondary regions forming respective PN junctions with the epitaxial layer; and a thin implanted layer of impurities of the first conductivity type in the sloped sidewall surface forming a low resistivity path for electrically connecting the secondary region to the substrate.

2. The device of claim 1 further comprising means disposed between the main and secondary regions for controlling the symmetrical blocking and breakdown voltage of the device.

3. The device of claim 2 wherein said means for controlling the symmetrical blocking and breakdown voltage of the device comprises a first junction termination extension comprising a region of first conductivity type extending laterally from the main region toward the secondary region, and a second junction termination extension comprising a region of first conductivity type extending laterally from the second region toward the first junction termination extension.

4. The device of claim 3 wherein said means for controlling the symmetrical blocking and breakdown voltage of the device further includes a field stop region situated between said first and second junction termination extensions.

5. The device of claim 3 wherein said junction termination extensions comprise impurities of the first conductivity type with concentration varying laterally from the sides of said main and secondary regions and vertically with depth from the upper surface of said epitaxial layer.

6. The device of claim 5 wherein said field stop region comprises impurities of the second conductivity type.

7. The device of claim 5 wherein the first and second junction termination extensions are spaced apart from each other at the upper surface of said epitaxial layer by a portion of the epitaxial layer.

8. The device of claim 2 wherein said means for controlling the symmetrical blocking and breakdown voltage of the device comprises a plurality of concentric field rings extending into the epitaxial layer from the upper surface thereof between the main and secondary regions.

9. The device of claim 8 wherein said means for controlling the symmetrical blocking and breakdown voltage of the device further comprises a field stop diffusion situated between inner and outer ones of said field rings.

10. The device of claim 9 wherein said field stop diffusion is of opposite type conductivity to said field rings.

11. The device of claim 1 further comprising a first passivation layer covering the upper surface of said epitaxial layer, and a second passivation layer covering the thin implanted layer in the sidewall.

12. The device of claim 1 wherein said second passivation layer comprises a polyamide.

13. The device of claim 1 further comprising a first electrode connected to the main region, and a second electrode connected to a backside of the substrate.

* * * * *